United States Patent [19]

Crafts

[11] Patent Number: 5,341,046

[45] Date of Patent: Aug. 23, 1994

[54] THRESHOLD CONTROLLED INPUT CIRCUIT FOR AN INTEGRATED CIRCUIT

[75] Inventor: Harold S. Crafts, Colorado Springs, Colo.

[73] Assignee: NCR Corporation, Dayton, Ohio

[21] Appl. No.: 986,184

[22] Filed: Dec. 7, 1992

[51] Int. Cl.$^5$ .............. H03K 5/153; H03K 3/295; H03K 19/0185

[52] U.S. Cl. ................. 307/475; 307/451; 307/360; 307/290

[58] Field of Search .............. 307/443, 451, 475, 360, 307/290

[56] References Cited

U.S. PATENT DOCUMENTS

| | | | |
|---|---|---|---|
| 4,029,971 | 6/1977 | Pryor | 307/209 |
| 4,217,502 | 8/1980 | Suzuki et al. | 307/205 |
| 4,242,604 | 12/1980 | Smith | 307/290 |
| 4,329,600 | 5/1982 | Stewart | 307/540 |
| 4,358,689 | 11/1982 | Jarrett et al. | 307/360 |
| 4,473,762 | 9/1984 | Iwahashi et al. | 307/443 |
| 4,488,067 | 12/1984 | Kraft et al. | 307/473 |
| 4,531,068 | 7/1985 | Kraft et al. | 307/473 |
| 4,563,595 | 1/1986 | Bose | 307/290 |
| 4,638,187 | 1/1987 | Boler et al. | 307/451 |
| 4,766,334 | 8/1988 | Warner | 307/540 |
| 4,782,250 | 11/1988 | Adams et al. | 307/473 |
| 4,855,623 | 8/1989 | Flaherty | 307/475 |
| 4,859,873 | 8/1989 | O'Shaughnessy et al. | 307/360 |
| 4,864,165 | 9/1989 | Hoberman et al. | 307/467 |
| 4,874,967 | 10/1989 | Deane | 307/296.8 |
| 4,877,978 | 10/1989 | Platt | 307/473 |
| 4,947,063 | 8/1990 | O'Shaughnessy et al. | 307/572 |
| 5,004,936 | 4/1991 | Andresen | 307/443 |
| 5,051,625 | 9/1991 | Ikeda et al. | 307/451 |
| 5,170,076 | 12/1992 | Smith | 307/360 |
| 5,179,299 | 1/1993 | Tipon | 307/443 |

FOREIGN PATENT DOCUMENTS 0228585  7/1987  European Pat. Off. ... H03K 19/092
8906068  6/1989  PCT Int'l Appl. .......... H03K 3/01

OTHER PUBLICATIONS

"Low Power Tri-State Driver Circuit" by W. R. Griffin and P. N. Horowitz, IBM Technical disclosure Bulletin, vol. 24 No. 5 Oct. 1981, pp. 2556–2557.

"High Speed Complementary Driver Circuit," by W. R. Griffin and P. N. Horowitz, IBM Technical Bulletin, vol. 24 No. 5 Oct. 1981 pp. 2558–2559.

Primary Examiner—Edward P. Westin
Assistant Examiner—Benjamin D. Driscoll
Attorney, Agent, or Firm—Paul W. Martin; Jack R. Penrod

[57] ABSTRACT

A method and apparatus for controlling a threshold of pad input circuits of an integrated circuit such that variations in manufacturing and environment will not substantially change its operating characteristics. The invention uses a very stable reference voltage supply whose output is controlled by a voltage divider circuit to determine the input threshold switching voltage of each pad input circuit. Since the voltage divider can be manufactured more accurately, i.e. with less variation, than the transistors on the integrated circuit and because one reference voltage supply can set the threshold for the entire chip, this invention provides a pad input circuit with accurate and stable input switching characteristics. Additionally the FETs on the inputs of the circuits are matched such that their individual values may vary with the manufacturing process, but as long as they vary in the same proportion, then the switching accuracy and noise immunity will be maintained.

11 Claims, 4 Drawing Sheets

THRESHOLD CONTROLLED INPUT CIRCUIT FOR AN INTEGRATED CIRCUIT

BACKGROUND OF THE INVENTION

The present invention relates to a binary input circuit and more particularly to an apparatus and method for controlling a threshold voltage of a binary input circuit of an integrated circuit.

Integrated circuits are designed using standard cells from a standard cell library. Standard cell libraries are not readily developed. Rather, such libraries must be laboriously worked out transistor by transistor and cell by cell by the designers. A typical library development cycle consists of defining the physical sizes of the devices, specifying the desired performance parameters, e.g. speed, noise margin, etc., designing the cells, simulating the cell designs, making prototype integrated circuits using the cell designs, and measuring the actual characteristics of the prototype integrated circuits. Usually the characteristics are used to go back and revise the design of various cells so that the desired performance parameters are met. This revision requires a second prototype set of integrated circuits and a measurement of the characteristics of the revised integrated circuits.

One of the more important cells in a library is the pad input cell. One of the harder things to do is design a library that is manufacturing process independent.

It is an object of the present invention to provide a highly stable highly accurate voltage reference circuit that sets a highly stable and highly accurate threshold voltage for a plurality of binary input circuits.

It is another object of the present invention to provide a process for producing an integrated circuit with a plurality of binary input circuits, each having its threshold voltage set by a common reference voltage circuit.

SUMMARY OF THE INVENTION

Briefly stated, in accordance with one aspect of the invention the foregoing objects are achieved by providing a type of binary circuit. This binary circuit includes a series summing amplifier having a first inverting input, a second inverting input and an output for providing a binary output voltage at said output that is a logic low if an input voltage of said first inverting input exceeds an input threshold voltage at said second inverting input, otherwise said binary output is a logic high. The threshold voltage is provided to said second inverting input from a reference voltage circuit connected thereto.

In another aspect of the invention, the aforementioned objects are achieved by providing a process for producing a binary integrated circuit with threshold control voltage on each data input circuit. This process includes the steps of: locating a reference voltage circuit that provides a reference control voltage at an output thereof on an integrated circuit chip; locating a plurality of data input circuits, each of which has a binary input that receives a respective binary input voltage, a threshold control input and a binary output; and connecting the reference control voltage output to each threshold control input to control a threshold voltage that defines the point at which a binary input voltage ceases to be defined as a logic zero and begins to be defined as a logic one.

BRIEF DESCRIPTION OF THE DRAWINGS

While the specification concludes with the appended claims particularly pointing out and distinctly claiming the subject matter which is regarded as the invention, it is believed that the invention will be better understood from the following description taken in conjunction with the accompanying drawings in which:

DETAILED DESCRIPTION

Figure 1:
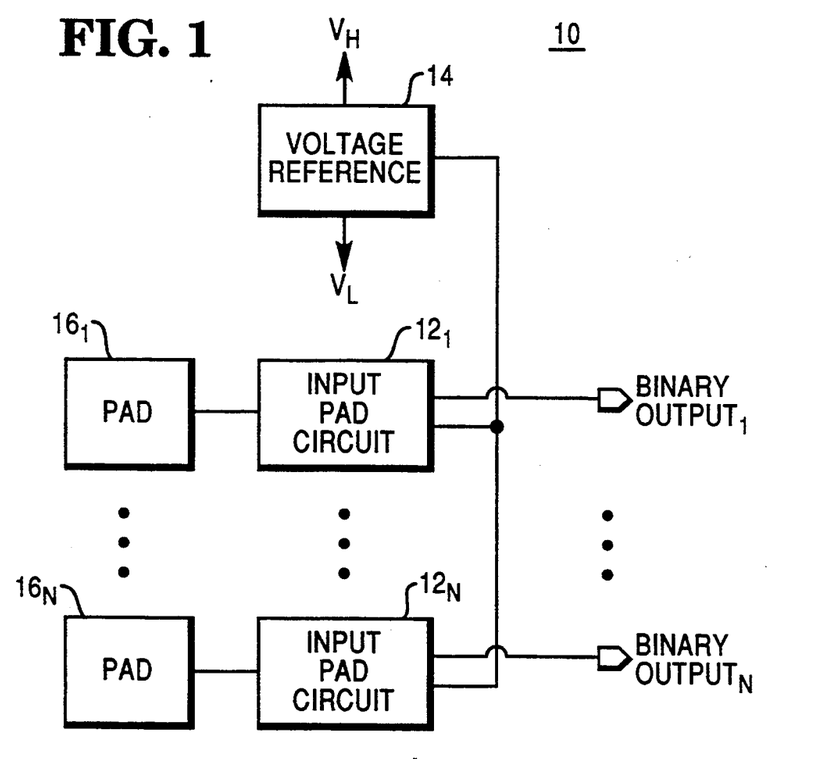
FIG. 1 is a block diagram showing the application of the invention to an integrated circuit.

Referring now to FIG. 1, part of an integrated circuit 10 is shown. Integrated circuit 10 has a number of binary input circuits $12_1$–$12_N$, each of which is connected to a common reference control voltage supply 14. Each of the binary input circuits $12_1$–$12_N$ is connected to a respective pad $16_1$–$16_N$ where an input lead (not shown) is physically and electrically connected in order to provide a binary input signal voltage. Reference control voltage supply 14 provides a reference control voltage that is derived from voltages commonly present on binary integrated circuits. This reference control voltage is used to precisely set the threshold voltage of each of the binary input circuits $12_1$–$12_N$. A data input voltage at or above the threshold voltage causes the binary input circuit $12_1$ to respond with a binary logic high output, while an input voltage below the threshold level causes the binary input circuit $12_1$ to respond with a binary logic low output. The remaining binary input circuits $12_2$–$12_N$ respond in substantially the same manner.

Figure 2:
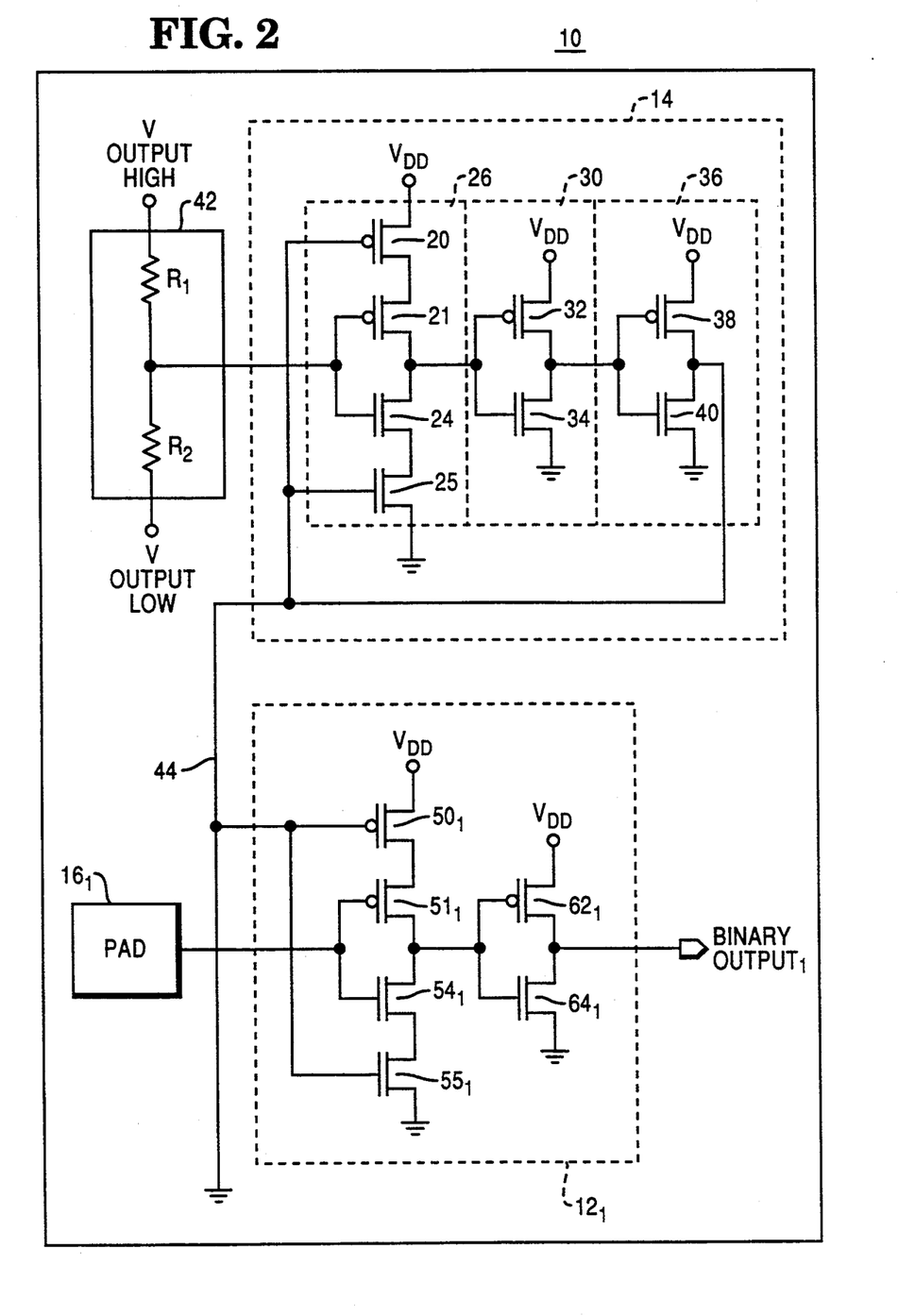
FIG. 2 is a schematic diagram of a CMOS embodiment of the invention.

Referring now to FIG. 2, a CMOS embodiment of the reference control voltage circuit 14 is shown in detail, as is one embodiment of the binary input circuit $12_1$ of the plurality of binary input circuits $12_1$–$12_N$. All of the plurality of binary input circuits $12_1$–$12_N$ are substantially the same, differing by manufacturing variations, so only binary input circuit $12_1$ will be described in connection with FIG. 2. Those skilled in the integrated circuit art will recognize that the embodiment shown in FIG. 2 could be readily adapted to other logic families such as BiCMOS, TTL, etc.

Reference control voltage circuit 14 is made up of three stages. The first stage is a series summing amplifier stage. The series summing amplifier is made up of two p-channel field effect transistors (FETs) 20, 21 and two n-channel FETs 24, 25. Those skilled in the art of CMOS logic will recognize that each FET channel has a channel terminating electrode (CTE) at each of the two channel ends and a gate as the control electrode. Since in CMOS integrated circuits the FETs are highly symmetrical, CTE is more descriptive because there is no difference between the source electrode and the drain electrode, except for voltage connections.

P-channel FET 20 has its first CTE connected to the positive supply voltage bus $V_{DD}$ of the integrated circuit chip 10. A second CTE of p-channel FET 20 is connected in series with a first CTE of p-channel FET 21. A second CTE of p-channel FET 21 is connected in series with a first CTE of n-channel FET 24. A second CTE of n-channel FET 24 is connected in series to a first CTE of a second n-channel FET 25. A second CTE of the n-channel FET 25 is connected to circuit ground of the integrated circuit 10. A gate of p-channel FET 20 is connected to a gate of n-channel FET 25. A gate of p-channel FET 21 is connected to a gate of n-channel FET 24. FETs 21, 22, 24 and 25 connected in this manner form a series summing amplifier 26. The common connection of the gates of FETs 21 and 24 is the first inverting input and the common connection of the gates of FETs 20 and 25 is the second inverting input of the series summing amplifier 26. The output of this series summing amplifier 26 is the common connection of the second CTE of FET 21 and the first CTE of FET 24.

The output of the series summing amplifier 26 is connected to a CMOS inverter 30. CMOS inverter 30 is made up of a p-channel FET 32 and n-channel FET 34. A first CTE of FET 32 is connected to $V_{DD}$. A second CTE of FET 32 is connected in series to a first CTE of FET 34. A second CTE of FET 34 is connected to circuit ground. A gate of FET 32 is connected to a gate of FET 34, and together they form the input of CMOS inverter 30. The output of CMOS inverter 30 is the common connection of the second CTE of FET 32 and the first CTE of FET 34.

The output of the inverter 30 is connected to another CMOS inverter 36. CMOS inverter 36 is made up of a p-channel FET 38 and n-channel FET 40. A first CTE of FET 38 is connected to $V_{DD}$. A second CTE of FET 38 is connected in series to a first CTE of FET 40. A second CTE of FET 40 is connected to circuit ground. A gate of FET 38 is connected to a gate of FET 40, and together they form the input of CMOS inverter 36. The output of CMOS inverter 36 is the common connection of the second CTE of FET 38 and the first CTE of FET 40.

The first inverting input of the series summing amplifier 26 is connected to a voltage reference 42, which in this embodiment is a pair of resisters $R_1$ and $R_2$, connected in a voltage divider configuration dividing the difference in potential between $V_{LOGIC\ OUTPUT\ HIGH}$ and $V_{LOGIC\ OUTPUT\ LOW}$. The output of the voltage reference 42 is $(V_{LOH}-V_{LOL})(R_2)/(R_1+R_2)$ according to the well known law of voltage division. Resistors $R_1$ and $R_2$ can be manufactured such that their ratio is within 1% of the design center value. Thus, the voltage divider output will be within 1% of the desired division of the potential between $V_{LOH}$ and $V_{LOL}$. Further, because $R_1$ and $R_2$ are manufactured on the same chip by the same process, variations related to the manufacturing process will occur equally to both resistors resulting in a voltage division ratio that is highly accurate and very stable.

The logic HIGH and logic LOW levels are nominally 5.0 volts, i.e. $V_{DD}$, and 0.0 volts, i.e. $V_{SS}$, for typical CMOS digital integrated circuits; however, it may be desirable to provide a logic HIGH voltage that is different from the 5.0 volt $V_{DD}$ and the 0.0 volt $V_{SS}$ in order to reduce power dissapation. The circuit shown in FIG. 2 is particularly adaptable to operate with a logic HIGH of 2.0 volts and a logic LOW of 1.0 volts in order to provide low power dissapation binary signal levels between integrated circuits.

The voltage of the voltage reference 42 is applied to the first inverting input of series summing amplifier 26, where it is inverted and amplified. An inverted and amplified version of the input, that is present at the output of series summing amplifier 26, is applied to the input of inverter 30, where the voltage is inverted and amplified a second time. An inverted and amplified version of the input, that is present at the output of inverter 30, is applied to the input of inverter 36 where the voltage is inverted and amplified a third time. The output of the inverter 36, which is an inverted and amplified version of the voltage of reference voltage 42, is fed back to the second inverting input of the series summing amplifier 26. Since the voltage that is fed back has a net inversion with respect to its inverting inputs and since the fed back voltage is applied to the second inverting input of series summing amplifier 26, this is a negative feedback voltage. Connected in this manner, if FETs 20, 21, 24, and 25 all had the same magnitude of transconductance, then the dynamics of reference voltage circuit 14 would drive the output voltage thereof towards the level of the reference voltage 42 impressed upon its first input. However, the transconductance of FETs 20, 21, 24, and 25 are selected by adjusting their channel widths such that the operating point of the first inverting input of reference voltage circuit 14 is centered about $(V_{LOH}-V_{LOL})/2$ and the operating point of the output, i.e. the second inverting input, is centered about $V_{DD}/2$. To effect these operating points, the magnitude of the transconductance of FET 20 is matched to that of FET 25 and the magnitude of the transconductance of FET 21 is matched to that of FET 24, and the ratio of the transconductance magnitudes of FETs 21, 24 to FETs 20, 25 are adjusted until the two desired operating points are achieved. Since the desired operating points are set by transconductance ratios, they tend to be manufacturing process independent. This is because any manufacturing variations tend to effect the transconductance magnitudes of FETs 20, 25 proportionately the same as the transconductance magnitudes of FETs 21, 24, thereby maintaining the desired ratios and operating points. This is in addition to the stability and accuracy that the negative feedback provides to voltage reference circuit 14. The stable and accurate voltage outputted by voltage reference circuit 14 is connected to conductor 44, which is connected to the binary input $12_1$, as will be described below.

Binary input circuit $12_1$ has a series summing amplifier that is made up of two p-channel FETs $50_1$, $51_1$ and two n-channel FETs $54_1$, $55_1$. P-channel FET $50_1$ has its first CTE connected to the positive supply voltage bus $V_{DD}$. A second CTE of p-channel FET $50_1$ connected in series with a first CTE of p-channel FET $51_1$. A second CTE of p-channel FET $51_1$ is connected in series with a first CTE of n-channel FET $54_1$. A second CTE of n-channel FET $54_1$ is connected in series to a first CTE of a second n-channel FET $55_1$. A second CTE of the n-channel FET $55_1$ is connected to circuit ground. A gate of p-channel FET $50_1$ is connected to a gate of n-channel FET $55_1$. A gate of p-channel FET $51_1$ is connected to a gate of n-channel FET $54_1$. FETs $51_1$, $52_1$, $54_1$ and $55_1$ connected in this manner form a series summing amplifier stage. The common connection of the gates of FETs $51_1$ and $54_1$ is the first inverting input of the summing amplifier stage and the common connection of the gates of FETs $50_1$ and $55_1$ is the second inverting input of the summing amplifier stage. The output of this series summing amplifier stage is the common connection of the second CTE of FET $51_1$ and the first CTE of FET $54_1$.

Another CMOS inverter stage is comprised of a p-channel FET $62_1$ and an n-channel FET $64_1$. A first CTE of FET $62_1$ is connected to $V_{DD}$. A second CTE of FET $62_1$ is connected in series to a first CTE of FET $64_1$. A second CTE of FET $64_1$ is connected to circuit ground. A gate of FET $62_1$ is connected to a gate of FET $64_1$ to form the input of this inverter stage. The input of this inverter stage is connected to the output of the summing amplifier at the common connection of the second CTE of FET $51_1$ and the first CTE of FET $54_1$. The output of this CMOS inverter stage is taken from the common connection of the second CTE of FET $62_1$ and the first CTE of FET $64_1$. This output is also called Binary Output$_1$ of the binary input circuit $12_1$.

A binary input pad $16_1$ is connected to the first inverting summing amplifier input that is also one of the non-inverting inputs of the binary input circuit $12_1$ because of the additional inversion performed by the CMOS inverter stage formed by FETs $62_1$, $64_1$. Similarly, the second inverting summing amplifier input is a second inverting input of the binary input circuit $12_1$. The second inverting input of the binary input circuit $12_1$ is connected via conductor 44 to the output of the reference control voltage supply 14. Reference control voltage supply 14 is also connected to all of the other binary input circuits $12_2$–$12_N$ (as shown in FIG. 1).

The reference control voltage supply 14 by connection to the second inverting input of binary input circuit $12_1$ sets a threshold beyond which the voltage level that the voltage on the first inverting input must equal or exceed before a change in the binary input level will be experienced by the series summing amplifier formed by FETs $50_1$, $51_1$, $54_1$, and $55_1$. FETs $50_1$ and $55_1$ are crafted to have the same characteristics as FETs 20 and 25 respectively. Similarly, FETs $51_1$ and $54_1$ are crafted to have the same characteristics as FETs 21 and 24 respectively. Thus, the threshold voltage of the input circuit $12_1$ will be set to substantially $(V_{LOH}-V_{LOL})/2$ by the similarities of characteristics and structure with the reference voltage supply 14.

Once the threshold voltage set by reference voltage supply 14 is equaled or exceeded, by the voltage input on pad $16_1$ the high gain of the series summing amplifier of FETs $50_1$, $51_1$, $54_1$, and $55_1$ cascaded with the inverter of FETs $62_1$, $64_1$ causes the output of binary input circuit $12_1$ to be amplified all the way to a logic high voltage. Conversely, as long as the voltage input on pad $16_1$ is less than the threshold voltage of the high gain of the series summing amplifier of FETs $50_1$, $51_1$, $54_1$, and $55_1$ cascaded with the inverter of FETs $62_1$, $64_1$ causes the output of binary input circuit $12_1$ to be amplified all the way to a logic low voltage. Since the output voltage of the reference voltage supply 14 is accurately set by resistors $R_1$ and $R_2$ and maintained by a negative feedback circuit 26, 30, 36 that is stable relative to temperature and process variations, the lower data threshold can be accurately and stably set. Further because FETs $50_1$, $51_1$, $54_1$, and $55_1$ are similar in characteristics and structure to FETs $20_1$, $21_1$, $24_1$, and $25_1$, the operation of FETs $50_1$, $51_1$, $54_1$, and $55_1$ will be immune from manufacturing process variations as long as the characteristics of FETs $50_1$, $55_1$ maintains the desired ratio of their respective transconductances with FETs $51_1$, $54_1$.

Simulations of the embodiment shown in FIG. 2 have shown that this binary input circuit will tolerate variations in the intrinsic threshold voltage of the FETs ($V_T$) by 100 millivolts. This is many times the 5 to 10 millivolt variation in $V_T$ that normally occurs across an integrated circuit chip. Thus, a CMOS embodiment of an binary input circuit of an integrated circuit cell library may has been described where the input logic switching characteristic is set substantially by a pair of resistors in a voltage divider arrangement.

Figure 3:
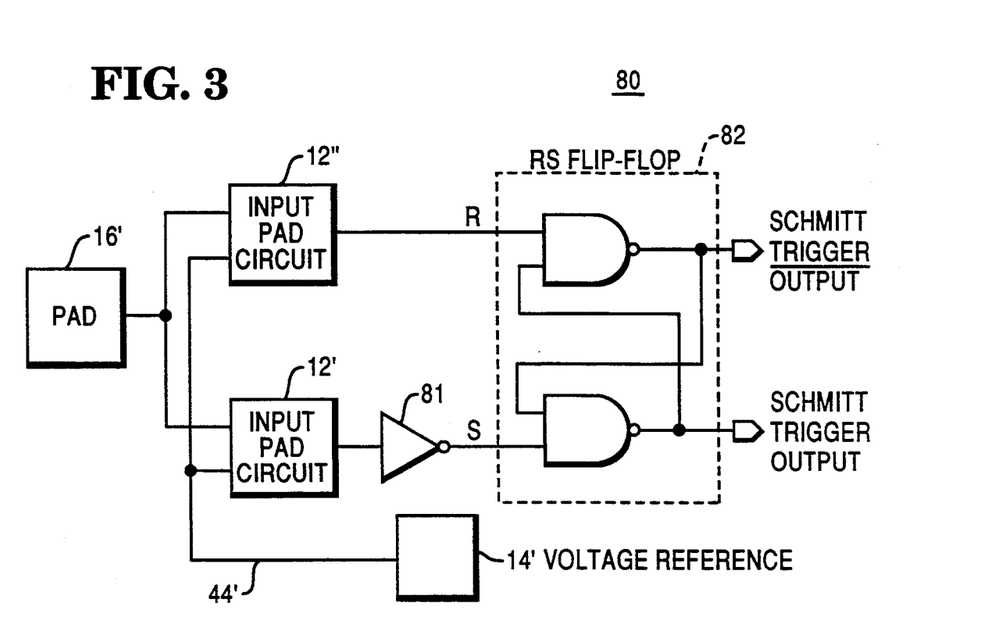
FIGS. 3 and 4 show the use of the invention in forming more complex Schmitt Trigger binary circuits using the invention.

Referring now to FIG. 3, another embodiment of a binary input circuit, called a Schmitt trigger circuit 80, is shown. Schmitt trigger circuit 80 has first and second binary input circuits 12', 12'', which are both substantially the same as the binary input circuit $12_1$ shown in FIG. 2. First binary input circuit 12' has its first inverting input connected to an input pad 16', which is substantially the same as the input pad 16 shown in FIG. 2. Input pad 16' is also connected to a first inverting input of binary input circuit 12''.

A reference voltage supply 14', which is substantially the same as reference voltage supply 14 shown in FIG. 2, is connected to a second inverting input of binary input circuit 12' by conductor 44'. Reference supply voltage 14' is also connected to a second inverting input of binary input circuit 12''. Since binary input circuits 12' and 12'' have their inputs connected identically, the FETs connected to the first and second inputs of binary input circuit 12' are with different transconductance ratios than the FETs connected to the first and second inputs of binary input circuit 12'' in order to provide two different switching points for the same threshold voltage. Connected in this manner, if the input voltage impressed on pad 16' is below the lower switch point, then the output of input circuit 12'' will be an active low and the output of the inverter 81 attached to the output of the input circuit 12' will be an inactive high. Thus, RS flip-flop 82 will be reset. If the voltage impressed on pad 16' is equal to or greater than the lower switch point but below the upper switching point, the output of the input circuit 12'' will change to an inactive high and the output of inverter 81 will remain at an inactive high. Thus, the RS flip-flop 82 will remain in its present state, which in this case is reset. If the voltage impressed on pad 16' is equal to or greater than the upper switching point, the output of input circuit 12'' will remain at inactive high and the output of inverter 81 attached to input circuit 12' will be an active low. Thus, the Schmitt trigger circuit 80 has both upper and lower switch points set by the output of the single reference voltage supply 14'.

Figure 4:
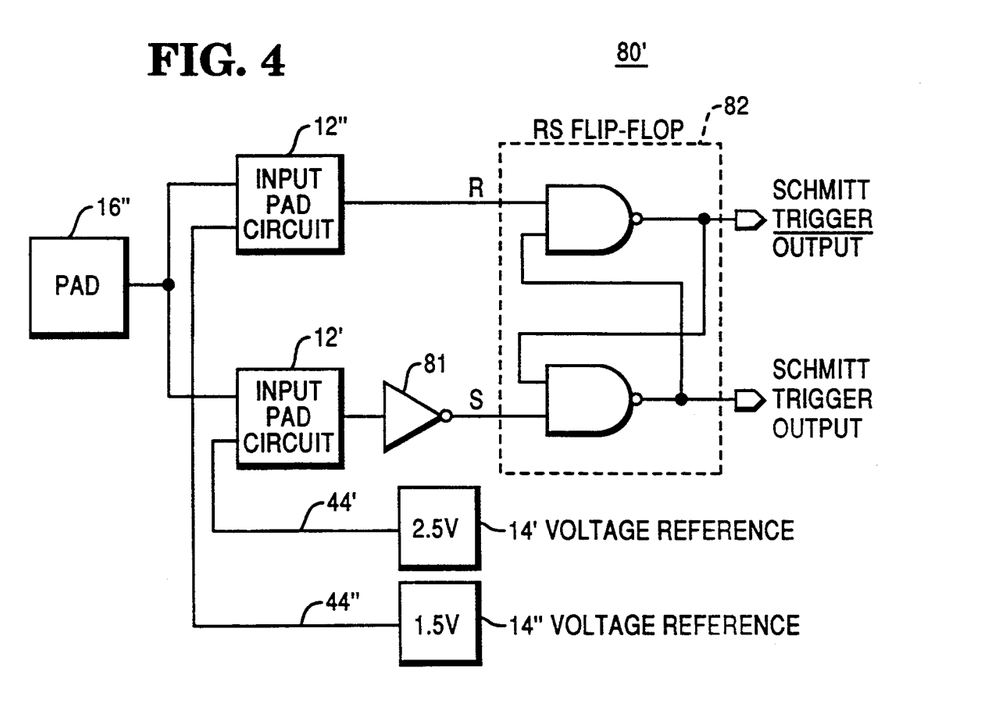

Referring now to FIG. 4, a Schmitt trigger 80' is shown. Schmitt trigger 80' is a variation of the Schmitt trigger circuit 80 shown in FIG. 3. The difference is that Schmitt trigger 80' has the first inverting input of binary input circuit 12'' connected by conductor 44'' to a second reference voltage supply 14''. The second reference voltage supply 14'' has its voltage divider ratio selected such that the output voltage of the second reference voltage supply 14'' is higher than the output voltage of the first reference voltage supply 14'. The first reference voltage supply 14' sets the lower Schmitt trigger threshold switching point and the second reference voltage supply 14'' sets the upper Schmitt trigger threshold switching point. Since the reference voltage supplies 14' and 14'' setting the upper and lower switching points, the input FETs of the binary input circuits 12', 12'' could be equivalent in respective transconductances to each other. Alternatively, the input FETs of the binary input circuits 12', 12'' could be adjusted such that each would have its operating point centered around its respective switching point.

Figure 5:
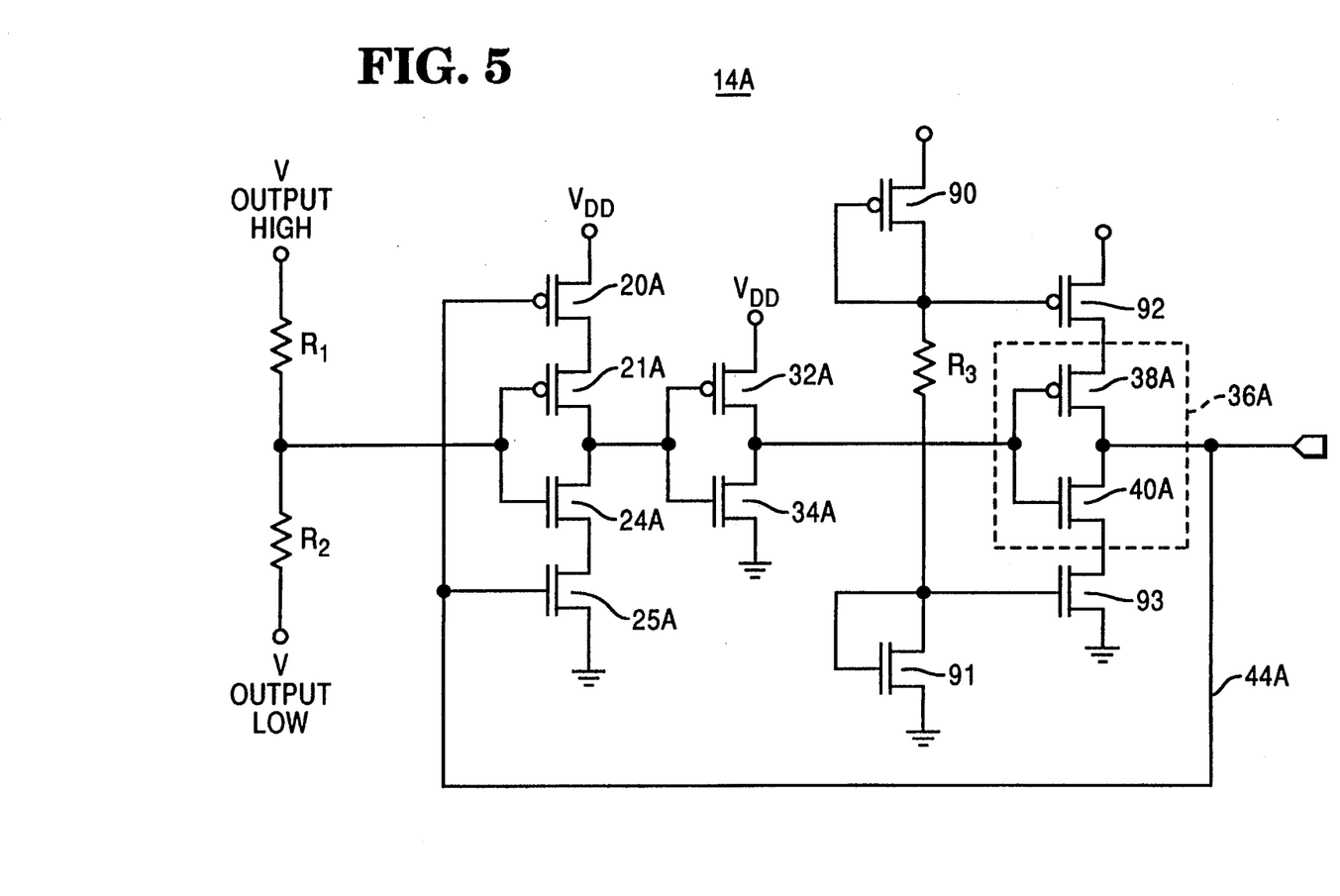
FIG. 5 is a schematic diagram of a second CMOS embodiment of the invention.

Referring now to FIG. 5, a reference voltage supply 14A which may be used instead of the reference voltage supply 14 shown in FIG. 2 on the integrated circuit 10. Reference voltage supply 14A is the same as reference voltage supply 14 with the addition of resistor $R_3$ and FETs 90, 91, 92 and 93. FET 90 has its gate connected to one CTE and its other CTE connected to $V_{DD}$. Similarly, FET 91 has its gate connected to one CTE and its other CTE connected to circuit ground. Resistor $R_3$ has a first lead connected to the gate-CTE junction of FET 90 and a second lead connected to the gate-CTE junction of FET 91. In this configuration, FET 90 will act as a diode having its anode connected to $V_{DD}$ and its cathode connected to the first lead of resistor $R_3$. Similarly, FET 91 will act as a diode having its anode connected to the second lead of the resistor and its cathode connected to circuit ground.

The output inverter 36A is substantially the same as the output inverter 36 shown in FIG. 2 with the addition of FETs 92 and 93. FET 92 is a p-channel type and has a first CTE connected to $V_{DD}$. A second CTE of FET 92 is connected to a first CTE of FET 38A. A second CTE of FET 38A is connected to a first CTE of FET 40A as with FETs 38 and 40 shown in FIG. 2. FET 93 is an n-channel type and has a first CTE connected to circuit ground and a second CTE connected to a second CTE of FET 40A. A gate of FET 92 is connected to the first lead of resistor $R_3$ and a gate of FET 93 is connected to the second lead of resistor $R_3$. FETs 90, 91, 92, and 93 and $R_3$ form a current mirror circuit in which the current through FET 90 is mirrored by, i.e. is substantially the same as, the current in FET 92 and the current in through FET 91 is mirrored by the current in FET 93. The current through FETs 92 and 93 is reduced to a low value by making $R_3$ as large as possible. This reduced current reduces any tendency of the feedback signal to induce oscillator behavior.

The reference voltage circuit 14A because of the added components has a better voltage regulation than the reference voltage supply 14 shown in FIG. 2, but at the cost of the extra components and the extra integrated circuit chip area occupied by the additional components. Thus, in FIGS. 2 and 5 a trade-off is provided to the integrated circuit designer between voltage regulation and smoothness provided by the reference voltage circuit and the area occupied by the voltage reference circuit.

Thus, it will now be understood that there has been disclosed a binary input circuit for an integrated circuit that has a high tolerance for manufacturing and environmental variations by using a reference voltage supply to select the switching threshold. A single reference voltage supply can set the switching threshold for a plurality of such input circuits. While the invention has been particularly illustrated and described with reference to preferred embodiments thereof, it will be understood by those skilled in the art that various changes in form, details, and applications may be made therein. For example more complex input circuits, such as Schmitt trigger input circuits may be built using multiple binary input circuits and one or two voltage reference circuits. It is accordingly intended that the appended claims shall cover all such changes in form, details and applications which do not depart from the true spirit and scope of the invention.

What is claimed as new and desired to be secured by Letters Patent of the United States is:

1. A binary circuit comprising:

a first series summing amplifier including a first p-channel FET, a second p-channel, FET, a first n-channel FET, and a second n-channel FET;

wherein the first p-channel FET, the second p-channel FET, the first n-channel FET, and the second n-channel FET are connected in series;

wherein a gate of the first p-channel FET is coupled to a gate of the first n-channel FET to provide a first inverting input;

wherein a gate of the second p-channel FET is coupled to a gate of the second n-channel FET to provide a second inverting input;

wherein the output node of said first series summing amplifier is located at the series connection point between said second p-channel FET and said second n-channel FET;

wherein the output node of said first series summing amplidfier provides a binary output voltage that is a logic low if an input voltage on said first inverting input exceeds an input voltage on said second inverting input by a threshold voltage, otherwise said binary output is a logic high; and first means for providing a first reference voltage connected to said first inverting input including a second series summing amplifier having a first inverting input, a second inverting input and an output; a first complementary series inverter stage having an input and an output; and a second complementary series inverter stage having an input and an output;

wherein said second series summing amplifier is connected between $V_{DD}$ and circuit ground;

wherein said input of the first complementary inverter stage is connected to said output of said second series summing amplifier; and wherein said input of said second complementary series inverter stage is connected to said output of said first complementary series inverter stage;

wherein said first inverting input is connected to a second reference voltage;

wherein said second inverting input is connected to said output of said second complementary series inverter; and wherein an output voltage at the output of said second complementary series inverter stage is said first reference voltage.

2. A binary circuit as set forth in claim 1, further comprising:

a third series summing amplifier including a first p-channel FET, a second p-channel FET, a first n-channel FET, and a second n-channel FET;

wherein the first p-channel FET, the second p-channel FET, the first n-channel FET, and the second n-channel FET are connected in series;

wherein a gate of the first p-channel FET is coupled to a gate of the first n-channel FET to provide a first inverting input;

wherein a gate of the second p-channel FET is coupled to a gate of the second n-channel FET to provide a second inverting input;

wherein the output node of said third series summing amplifier is located at the series connection point between said second p-channel FET and said second n-channel FET;

wherein the output node of said third series summing amplidfier provides a binary output voltage that is a logic low if an input voltage on said first inverting input exceeds an input voltage on said second inverting input by a threshold voltage, otherwise said binary output is a logic high; and wherein said means for providing a reference voltage is connected to said first inverting input of said third series summing amplifier.

3. A binary circuit as set forth in claim 1, further comprising:

a third series summing amplifier including a first p-channel FET, a second p-channel FET, a first n-channel FET, and a second n-channel FET;

wherein the first p-channel FET, the second p-channel FET, the first n-channel FET and the second n-channel FET are connected in series;

wherein a gate of the first p-channel FET is coupled to a gate of the first n-channel FET to provide a first inverting input;

wherein a gate of the second p-channel FET is coupled to a gage of the second n-channel FET to provide a second inverting input;

wherein the output node of said third series summing amplifier is located at the series connection point between said second p-channel FET and said second n-channel FET;

wherein the output node of said third series summing amplidfier provides a binary output voltage that is a logic low if an input voltage on said first inverting input exceeds an input voltage on said second inverting input by a threshold voltage, otherwise said binary output is a logic high;

wherein said means for providing a reference voltage is connected to said first inverting input of said third series summing amplifier;

means for providing a binary complement of a logic level impressed upon an input of said providing means at an output of said providing means, said providing means including a single input connected to said output of said first series summing amplifier; and a SET-RESET flip-flop having its SET input connected to said output of said providing means and its RESET input connected to said output of said third series summing amplifier;

wherein said second inverting input of said first series summing amplifier is connected to said second inverting input of said third series summing amplifier and to an input terminal; and wherein circuitry comprising a Schmitt trigger is formed from said input terminal to an output of said SET-RESET flip-flop.

4. A binary circuit as set forth in claim 1, further comprising:

a third series summing amplifier including a first p-channel FET, a second p-channel FET, a first n-channel FET, and a second n-channel FET;

wherein the first p-channel FET, the second p-channel FET, the first n-channel FET and the second n-channel FET are connected in series;

wherein a gate of the first p-channel FET is coupled to a gate of the first n-channel FET to provide a first inverting input;

wherein a gate of the second p-channel FET is coupled to a gate of the second n-channel FET to provide a second inverting input;

wherein the output node of said third series summing amplifier is located at the series connection point between said second p-channel FET and said second n-channel FET;

wherein the output node of said first series summing amplidfier provides a binary output voltage that is a logic low if an input voltage on said first inverting input exceeds an input voltage on said second inverting input by a threshold voltage, otherwise said binary output is a logic high;

second means for providing a reference voltage which is connected to said first inverting input of said third series summing amplifier;

means for providing a binary complement of a logic level impressed upon an input of said providing means at an output of said providing means, said providing means including a single input connected to said output of said first series summing amplifier means; and a SET-RESET flip-flop having its SET input connected to said output of said providing means and its RESET input connected to said output of said third series summing amplifier;

wherein said second inverting input of said first series summing amplifier is connected to said second inverting input of said third series summing amplifier and to an input terminal; and wherein circuitry comprising a Schmitt trigger is formed from said input terminal to an output of said SET-RESET flip-flop.

5. A binary circuit as set forth in claim 1 wherein said second reference voltage is provided by a voltage divider.

6. A binary circuit as set forth in claim 5 wherein said first complementary series inverter includes a p-channel FET connected in series with an n-channel FET.

7. A binary circuit as set forth in claim 6, wherein said second complementary series inverter includes a p-channel FET connected in series with an n-channel FET.

8. A binary integrated circuit comprising:

a voltage reference means for providing a highly accurate, highly stable first reference voltage;

a plurality of input pads for receiving external binary signals;

a plurality of input circuits, each substantially the same as the rest of the plurality of input circuits; and each of said plurality of input circuits having a data input connected to a respective input pad of said plurality of input pads and a threshold control voltage input connected to said voltage reference means;

each of said plurality of input circuits including a series summing amplifier including a first p-channel FET, a second p-channel FET, a first n-channel FET, and a second n-channel FET;

wherein the first p-channel FET, the second p-channel FET, the first n-channel FET, and the second n-channel FET are connected in series;

wherein a gate of the first p-channel FET is coupled to a gate of the first n-channel FET to provide a first inverting input which is the threshold control voltage input;

wherein a gate of the second p-channel FET is coupled to a gate of the second n-channel FET to provide a second inverting input which is the data input;

wherein the output node of said series summing amplifier is located at the series connection point between said second p-channel FET and said second n-channel FET;

wherein the output node of said series summing amplidfier provides a binary output voltage that is a logic low if an input voltage on said threshold control voltage input exceeds an input voltage on said data input by a threshold voltage, otherwise said binary output is a logic high;

wherein said reference voltage controls the threshold voltage and includes another series summing amplifier having a first inverting input, a second inverting input and an output; a first complementary series inverter stage having an input and an output; and a second complementary series inverter stage having an input and an output;

wherein said other series summing amplifier is connected between $V_{DD}$ and circuit ground;

wherein said input of the first complementary inverter stage is connected to said output of said other series summing amplifier; and wherein said input of the first complementary series inverter stage is connected to said output of said first complementary series inverter stage;

wherein said first inverting input is connected to a second reference voltage;

wherein said second inverting input is connected to said output of said second complementary series inverter; and wherein an output voltage at the output of said second complementary series inverter stage is said first reference voltage.

9. A binary integrated circuit as set forth in claim 8 wherein said second reference voltage is provided by a voltage divider.

10. A binary integrated circuit as set forth in claim 9 wherein said first complementary series inverter includes a p-channel FET connected in series with an n-channel FET.

11. A binary integrated circuit as set forth in claim 10 wherein said second complementary series inverter includes a p-channel FET connected in series with an n-channel FET.

* * * * *

UNITED STATES PATENT AND TRADEMARK OFFICE
CERTIFICATE OF CORRECTION

PATENT NO. : 5,341,046

DATED : August 23, 1994

INVENTOR(S) : Harold S. Crafts

It is certified that error appears in the above-indentified patent and that said Letters Patent is hereby corrected as shown below:

Column 9, line 18, delete "gage" and substitute --gate--.

Column 12, line 1, delete "the first" and substitute --said second--.

Signed and Sealed this

Twenty-sixth Day of September, 1995

Attest:

BRUCE LEHMAN

*Attesting Officer*       *Commissioner of Patents and Trademarks*